United States Patent
Kim et al.

(10) Patent No.: US 6,620,667 B2
(45) Date of Patent: Sep. 16, 2003

(54) METHOD OF MAKING A HF LDMOS STRUCTURE WITH A TRENCH TYPE SINKER

(75) Inventors: Cheon-Soo Kim, Taejon (KR); Hyun-Kyu Yu, Taejon (KR); Nam Hwang, Taejon (KR); Jung-Woo Park, Taejon (KR)

(73) Assignee: Electronics and Telecommunications Research Institute (KR)

( * ) Notice: Subject to any disclaimer, the term of this patent is extended or adjusted under 35 U.S.C. 154(b) by 0 days.

(21) Appl. No.: 10/160,447

(22) Filed: May 31, 2002

(65) Prior Publication Data

US 2002/0151124 A1 Oct. 17, 2002

Related U.S. Application Data

(62) Division of application No. 09/752,396, filed on Dec. 28, 2000.

(30) Foreign Application Priority Data

Nov. 4, 2000 (KR) .......................................... 2000-65358

(51) Int. Cl.⁷ .......................................... H01L 21/8234
(52) U.S. Cl. ...................................... 438/197; 438/209
(58) Field of Search ................................ 438/197, 201, 438/209; 257/335, 336, 337, 338, 339, 491, 492, 493, 578

(56) References Cited

U.S. PATENT DOCUMENTS

| | | | | |
|---|---|---|---|---|
| 4,819,052 A | * | 4/1989 | Hutter | 357/49 |
| 5,369,045 A | * | 11/1994 | Ng et al. | 437/44 |
| 5,841,166 A | * | 11/1998 | D'Anna et al. | 257/335 |
| 5,852,318 A | | 12/1998 | Chikamatsu et al. | |
| 5,898,198 A | | 4/1999 | Herbert et al. | |
| 6,242,787 B1 | * | 6/2001 | Nakayama et al. | 257/493 |
| 6,274,919 B1 | * | 8/2001 | Wada | 257/508 |
| 6,326,656 B1 | * | 12/2001 | Tihanyi | 257/288 |

FOREIGN PATENT DOCUMENTS

JP         02224274 A      *   9/1990    ......... H01L/29/784

OTHER PUBLICATIONS

120 Watt, 2GHz, Si LDMOS RF Power Transistor For PCS Base Station Applications.
High Performance Silicon LDMOS Technology For 2GHz RF Power Amplifier Applications.

* cited by examiner

*Primary Examiner*—Carl Whitehead, Jr.
*Assistant Examiner*—David S Blum
(74) *Attorney, Agent, or Firm*—Blakely, Sokoloff, Taylor & Zafman

(57) ABSTRACT

A method of forming an HF power device. The method includes forming a semiconductor layer as a first conductive type on a semiconductor substrate; etching the semiconductor layer forming a first trench; doping an impurity in the neighborhood of the first trench forming a first impurity layer; burying a conduction film into the first trench; etching the semiconductor layer forming a second trench; forming a field oxide film buried into the second trench; forming a gate electrode on a surface of the semiconductor layer; forming a source on the surface of the semiconductor layer; forming a drain area on the surface of the semiconductor layer; forming an LLD area on the surface of the semiconductor layer between the drain area and the gate electrode; forming a first metal electrode; and forming a second metal electrode electrically connected to the LDD area.

7 Claims, 9 Drawing Sheets

METHOD OF MAKING A HF LDMOS STRUCTURE WITH A TRENCH TYPE SINKER

The present patent application is a Divisional of prior Application Ser. No. 09/752,396, filed Dec. 28, 2000.

FIELD OF THE INVENTION

The present invention relates to a high-output power device; and, more particularly, to an HF power device applicable to a power amplifier of a base station for a mobile communication system such as a cellular, a personal communication service (PCS) and an IMT (International Mobile Telecommunication)-2000 etc.

In addition, the present invention is relates to an HF power device applicable even to a mobile station based on a little watt in case that a structure of the device becomes scale-down, though it is being applied to a power amplifier of the base station for scores of or hundreds of watt.

PRIOR ART OF THE INVENTION

In general, a MOSFET (Metal Oxide Silicon Field Effect Transistor) used as a power device has high input impedance in comparison with a bipolar transistor, thus a power gain is high and a gate driving circuit is very simple. Also the MOSFET is a unipolar device, thus it has a merit that there is less time delay occurring by a re-combination or an accumulation caused by a minority carrier during a turning-off of the device.

Therefore, it is presently getting gradually spread an application to a switching mode power supply, a lamp ballast and a motor driving circuit.

In such MOSFET, a DMOSFET (Double diffused MOSFET) using planar diffusion technique is generally used, and herewith, as a representatively used power device, an LDMOS (Laterally Double diffused MOS) structure is being used widely.

FIG. 1 is a structure diagram in a conventional technique.

As shown in FIG. 1, in the LDMOS based on the conventional technique, the MOSFET is made on a wafer 13 which is constructed by P⁻ epitaxy layer 12 on P⁺ substrate 11. What this is different from a general MOSFET device manufacturing process is that an overall lower part of the substrate is used as common source electrode 22 by forming a P⁺ sinker 14 on a source side of the wafer 13 and connecting with a P⁺ substrate 11.

Further, in designing the device in a multi-finger shape, there is no need to connect several numbers of source electrodes with one another, to thereby enable to reduce a parasitic capacity by an overlapping of a metal wire and serve as an important role of a heat sink by a source of a wide area. Herewith, non-described reference number 15 indicates polysilicon, 16 represents tungsten silicide, 17 as a channel ion injection layer, 18 as an LDD area, 19 as N⁺ source and drain, 20 as a P⁺ enhancement layer for lessening a resistance of a P⁺ sinker 14, 21 as an insulation film, 22 as source electrode, and 23 indicates drain electrode.

Meantime, it is on the rise very importantly a process of forming the P⁺ sinker 14 in a source side.

In the conventional technique as the above, in order to form the P⁺ sinker 14, high energy and high concentration of ions are implanted into the source area, and this is diffused by a thickness of the P⁻ the epitaxy layer 12 at high temperature for a long time to be connected to the P⁺ substrate 11. Such structure seriously causes an unnecessary lateral diffusion owing to the diffusion for a long time, thus an area of the device becomes large, and a parasitic resistance and a parasitic capacitance are increased by such result, which is an important cause of reducing an HF characteristic of the power device.

Furthermore, the conventional LDMOS structure thickly grows a field oxide film by thickness of 2 μm~3 μm to reduce the parasitic capacitance, that is, a high thermal anneal process is required correspondingly to the thickness of the field oxide film, and a scale-down extent of the device and a flat degree of the wafer become bad to cause a difficulty in fabricating the device.

SUMMARY OF THE INVENTION

Therefore, it is an object of the present invention to provide an HF power device and its manufacturing method, which are capable of preventing an HF characteristic of a power device from being reduced by forming a low-resistance sink through a thermal anneal process at low temperature of 1000° C. and below, and so by restraining an area increase of the device and an increase of a parasitic resistance and a parasitic capacitance.

Another object of the present invention is to provide an HF power device and its manufacturing method for restraining a drop of a scale-down extent and a flat degree of the device in forming a field oxide film.

To achieve these and other advantages, and in accordance with the purpose of the present invention, the HF power device includes a first conductive type semiconductor layer; a field area formed by a trench structure on one side of the semiconductor layer; gate electrode formed on a given surface of the semiconductor layer; a second conductive type channel layer which is laterally diffused from the field area to a width containing both sides of the gate electrode, and formed on the surface of the semiconductor layer; a second conductive type source area formed within the channel layer between one side of the gate electrode and the field area; a second conductive type drain area formed on the surface of the semiconductor layer with a given interval from another side of the gate electrode; a first conductive type sinker, which is provided by a column shape of a trench structure for dividing into two source areas by a piercing through the source area, and is connected to the semiconductor layer; a second conductive type LDD area formed on the surface of the semiconductor layer between the drain area and the gate electrode; first metal electrode contacted with the source area divided into two source areas and electrically connected to the semiconductor layer through the sinker; and second metal electrode contacted with the drain area.

In accordance with the present invention, the method of manufacturing an HF power device includes the steps of forming a first conductive semiconductor layer on a first conductive semiconductor substrate; etching the first conductive semiconductor layer by a given depth and forming a first trench; doping first conductive impurity on the neighborhood of the first trench and forming a first conductive/first impurity layer connected to the first conductive semiconductor substrate; burying a conduction film of a first conductive type in the first trench; etching the first conductive semiconductor layer by a given depth and forming a second trench with a constant interval from the first trench; forming a field oxide film buried in the second trench; forming gate electrode on a given surface of the first conductive semiconductor layer; forming a second conductive source area on the surface of the first conductive semiconductor layer so as to be structurally self-aligned on one side of the gate electrode and be structurally pierced by the first conductive conduction film; forming a second conductive drain area on the surface of the first conductive semiconductor layer with a given distance from another side of the gate electrode; forming a second conductive/second impurity layer on the surface of the first conductive semiconductor layer between the second conductive drain area and the gate electrode; forming first metal electrode having a width which reaches the second conductive source area and the gate electrode; and forming second metal electrode electrically connected to the second conductive/second impurity layer.

BRIEF DESCRIPTION OF THE DRAWINGS

The above and other objects and features of the instant invention will become apparent from the following description of preferred embodiments taken in conjunction with the accompanying drawings, in which.

PREFERRED EMBODIMENT OF THE INVENTION

Hereinafter, preferred embodiments of the present invention will be described in detail with reference to the accompanying drawings.

Figure 1:
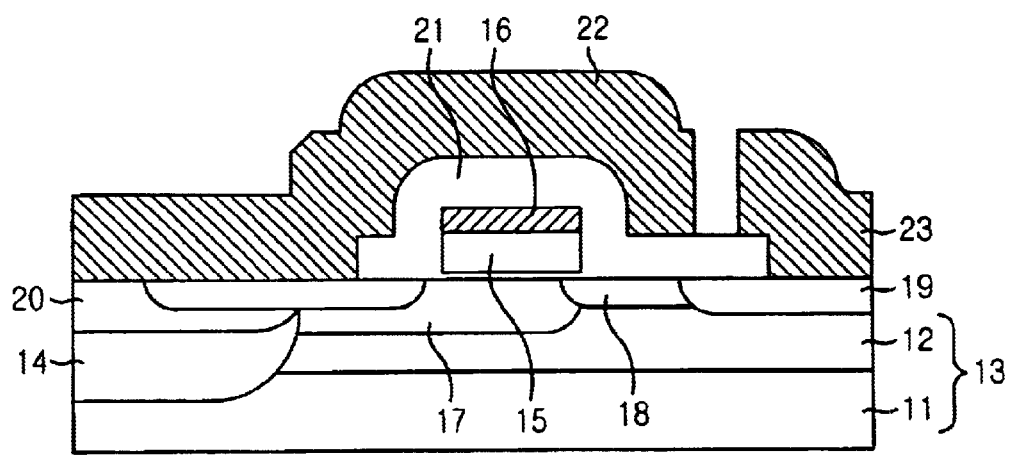
FIG. 1 is a sectional view for a structure of an LDMOS in a conventional technique.
Figure 2:
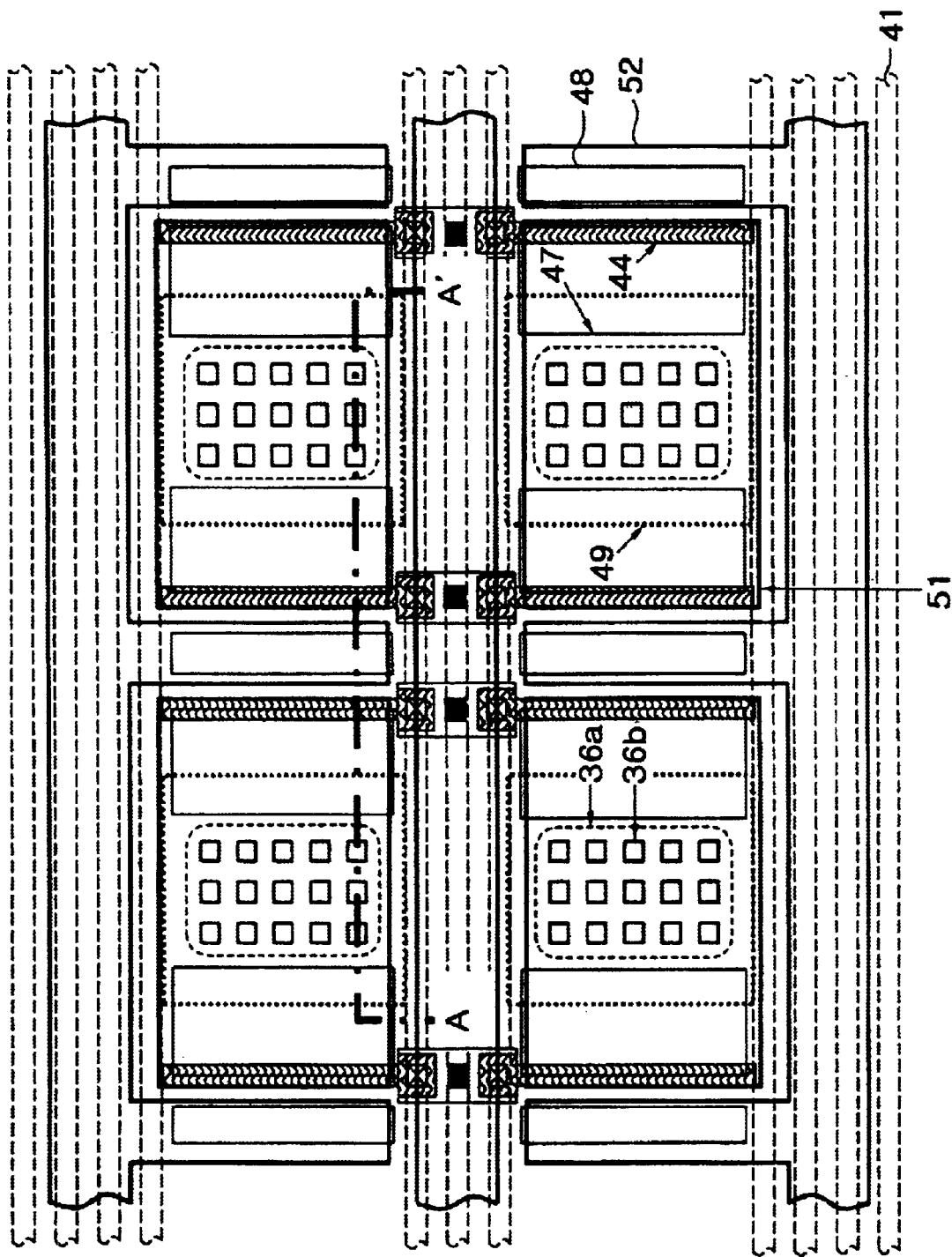
FIG. 2 represents a plane view of an HF LDMOS in a first embodiment of the present invention.

FIG. 2 is a structural plane view of an HF power device in a first embodiment of the present invention. In FIG. 2, it is formed source electrode 51 wide in comparison with drain electrode 52, and a $P^+$ doping layer 36a of a column shape and a $P^+$ sinker 37 (of FIG. 3) formed by a poly-silicon column 36b are connected to a center portion of a lower part of the source electrode 51. Herewith, the $P^+$ poly-silicon column 36b is buried into numerous trenches or into one trench, and the $P^+$ doping layer 36a is formed on the neighborhood of one or numerous trenches.

Both sides of the $P^+$ sinker 37 are connected with $N^+$ source areas 47 of adjacent devices, in other words, the $P^+$ sinker 37 is formed commonly in the adjacent devices, and the $P^+$ sinker 37 and the $N^+$ source areas 47 of the mutually adjacent devices are connected to one source electrode 51.

Also, the source electrode 51 is overlapped on a gate electrode 44 of the adjacent devices, and drain areas 48 of the respective devices are connected to respective drain electrodes 52.

A field oxide film 41 for an isolation between the adjacent devices is formed, being buried into one or numerous trenches.

As the above-mentioned, in the HF power device based on the first embodiment of the invention, the $P^+$ sinker 37(of FIG. 3) and the field oxide film 41 are buried into the trench, and since the $P^+$ sinker 37 has a column shape that the $P^+$ doping layer 36a and the $P^+$ polysilicon column 36b are buried into the trench, a low-temperature thermal anneal for a shorter time in comparison with the convention's is valid in forming the $P^+$ doping layer 36a. According to that, the lateral diffusion is restrained to reduce the area of the device and prevent an increase of the parasitic capacity.

Figure 3:
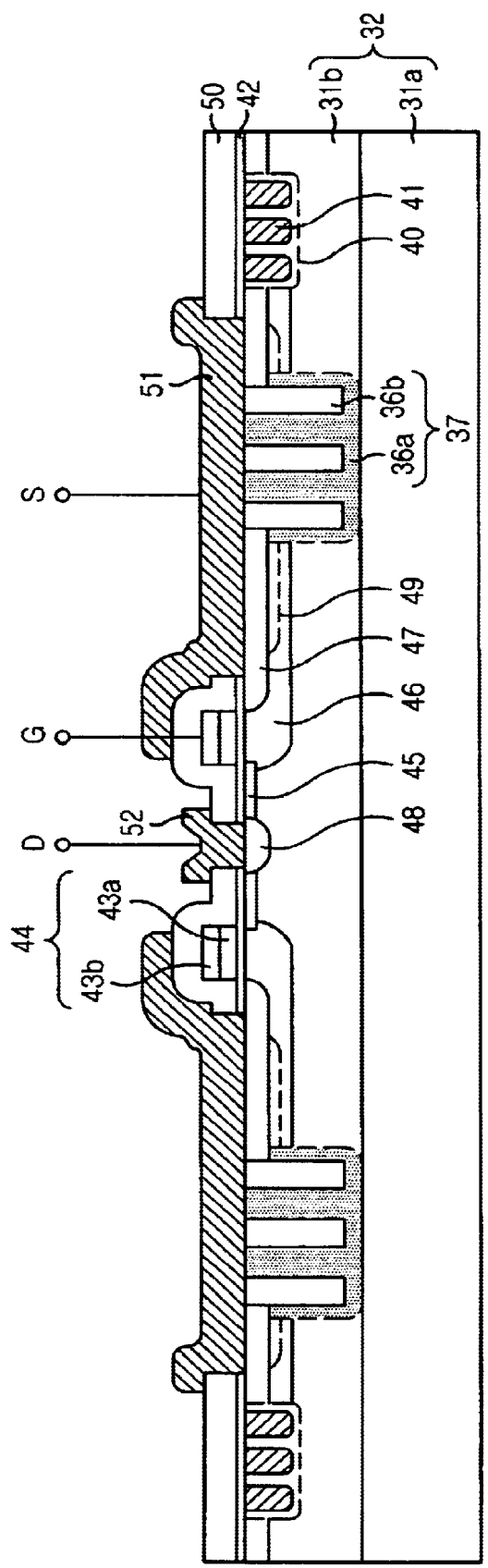
FIG. 3 depicts a structural sectional view of an HF LDMOS taken along the line A–A' of FIG. 2.

FIG. 3 is a structural sectional view of an HF power device taken along the line A–A' of FIG. 2, and it is constructed by a $P^-$ semiconductor layer 31b epitaxial-grown on a $P^+$ substrate 31a; a field oxide film 41 formed by a trench structure on one side of the $P^-$ semiconductor layer 31b; a polysilicon 43a formed on a given surface of the $P^-$ semiconductor layer 31b and gate electrode 44 of a tungsten silicide 43b laminating structure; a channel layer 46 laterally diffused from the field oxide film 41 to both sides of the gate electrode 44, and formed on the surface of the $P^-$ semiconductor layer 31b; an $N^+$ source area 47 formed within the channel layer 46 between one side of the gate electrode 44 and the field oxide film 41; an $N^+$ drain area 48 formed on the surface of the $P^-$ semiconductor layer 31b with a given interval from another side of the gate electrode 44; a $P^+$ sinker 37 provided as a column shape of a trench structure for dividing into two source areas by a piercing through the $N^+$ source area 47, and connected to the $P^+$ substrate 31a; an $N^-$ LDD area 45 formed on the surface of the $P^-$ semiconductor layer 31b between the $N^+$ drain area 48 and the gate electrode 44; source electrode 51 contacted with the $N^+$ source area 47 divided into two source areas and electrically coupled with the $P^+$ substrate 31a through the $P^+$ sinker 37; and drain electrode 52 contacted with the $N^+$ drain area 48.

The $P^+$ sinker 37 includes the $P^+$ polysilicon column 36b buried into one or numerous trenches formed by etching the $P^-$ semiconductor layer 31b by a given depth and the neighborhood of the trench, namely, a $P^+$ doping layer 37b provided by a doping on a lower part and a side wall thereof.

Also, there is formed a $P^+$ enhancement layer 49 having a depth between the channel layer 46 and the $N^+$ source area 47 and a width narrower than the $N^+$ source area 47 to reduce a resistance of the $P^+$ sinker 37.

Moreover, in the inventive HF power device, since the source electrode 51 is coupled with the $N^+$ source area 47 containing the $P^+$ sinker 37 of the trench structure, thus has a wider width in comparison with the drain electrode 52, an overall area of the $P^+$ substrate 31a can be used as common source electrode. That is, as shown in FIG. 2, the $P^+$ sinker having the column shape of the trench structure is coupled with a center portion of the $N^+$ source area 47 divided into two source areas, to reduce the resistance, and the source electrode 51 is formed by a width overlapped on the $N^+$ source area 47 divided into two source areas by the gate electrode 44 and the $P^+$ sinker 37.

FIGS. 4a through 4d are manufacture process sectional views of the HF power device in the first embodiment of the present invention.

Figure 4A:
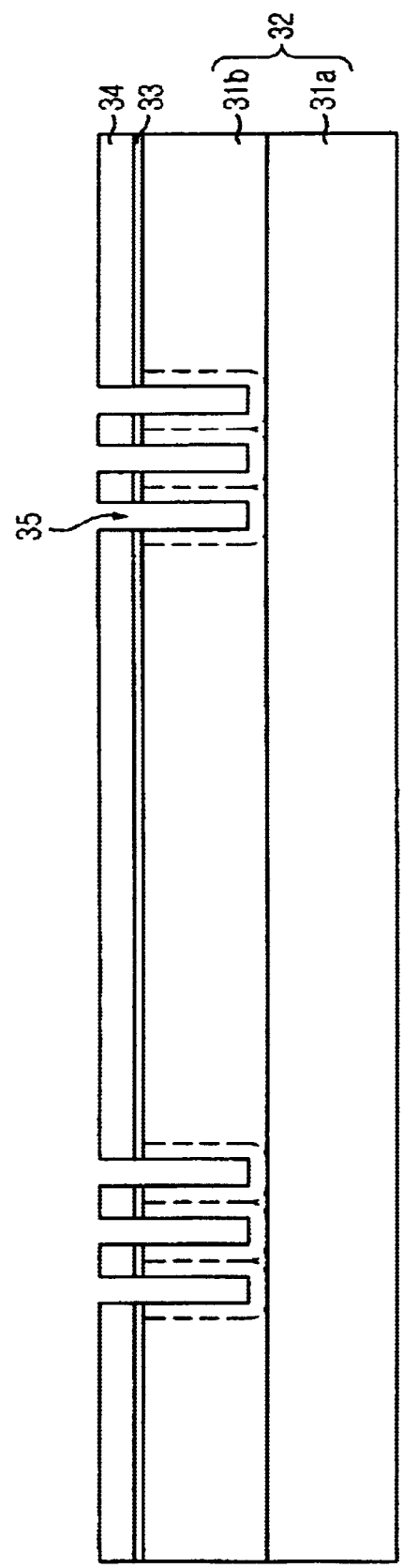
FIG. 4 is a process sectional view showing a method of manufacturing an HF LDMOS in a first embodiment of the present invention.

As shown in FIG. 4a, the $P^+$ epitaxy layer 31b of 6~30 Ω-cm is grown by a thickness of 3 μm~10 μm on the $P^+$ substrate 31a doped with a high consistency and the semiconductor substrate 32 is formed, then a first silicon oxide film ($SiO_2$) 33 and a first silicon nitride film ($Si_3N_4$) 34 are formed on the semiconductor substrate 32.

Subsequently, a photosensing film (not shown) is deposited on the first silicon nitride film 34, and a mask is formed to expose a subsequent source area, for example, a portion to be formed as the $P^+$ sinker 37, through an exposure and a developing. After that, the first silicon nitride film 34 and the first silicon oxide film 33 provided in the lower part thereof are etched by using the mask, and continuously, the P⁺ epitaxy layer 32 provided in the lower part thereof is etched by the thickness of the P' epitaxy layer 32 then a first trench 35 is formed.

At this time, an overall area of the P⁺ sinker can be formed as one trench or as a plural number of trenches in forming the first trench 35.

Next, in order to dope the interior of the first trench 35, in detail, side walls and a lower part thereof, by a P⁺ type, P⁺ ion is doped by using a boron nitride (BN) wafer as a source of boron ion, to thus form the P⁺ doping layer 36a on the side walls and the lower part of the first trench 35. At this time, the P⁺ doping layer 36a is decided in a thermal anneal time or each width of the first trench 35 so as to be contacted with a neighboring other first trench area each other (case of forming numerous trenches) and be also contacted with the lower P⁺ substrate 31a.

Figure 4B:
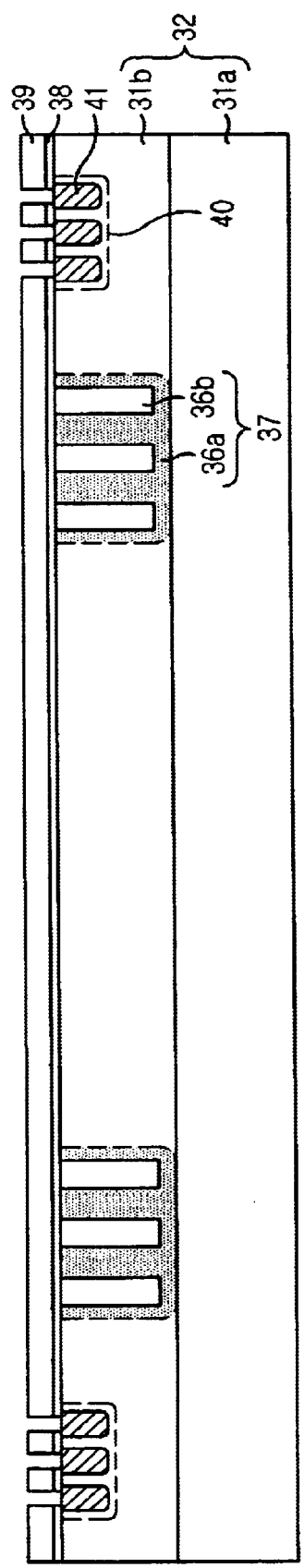

As shown in FIG. 4b, the P⁺ type doped polysilicon is formed on an overall face containing the first trench 35 is formed, and then the P⁺ polysilicon column 36b buried into the first trench 35 is formed by executing a chemical mechanical polishing (CMP).

As the above-described, the ion injection of high energy and a high-temperature diffusion process can be omitted by forming the P⁺ sinker 37 based on the column shape constructed by the P⁺ doping layer 36a and the P⁺ polysilicon column 36b in the source area, further an area of the device can be reduced by easily forming the low-resistance sinker through the low-thermal anneal process.

Then, a second silicon oxide film 38 and a second silicon nitride film 39 are formed on an overall face containing the P⁺ polysilicon column 36b buried into the first trench 35, after that, the second silicon nitride film 39 and the second silicon oxide film 38 are selectively patterned to expose a portion where a subsequent field oxide film will be grown.

Next, the lower P⁻ epitaxy layer 31b is etched by a depth of 1 $\mu$m~3 $\mu$m by using the patterned the second silicon nitride film 39 and a second silicon oxide film 40 as the mask, to form a second trench (not shown). At this time, the second trench where a field oxide film for an isolation between devices will be formed, is distanced from the P⁺ sinker 37 by a given interval, more shallowly than a depth of the first trench 35 having the formation of the P⁺ sinker 37, and also is formed as one trench or a plural number of trenches.

Then, the field ion injection is performed by using the patterned second silicon nitride film 39 and the second silicon oxide film 38 as a mask, to form side walls and a lower part of the second trench, namely, a channel stop layer 40 on the P⁻ epitaxy layer 31b, and after that, it is grown a field oxide film 41 for burying the second trench having the formation of the channel stop layer 41.

In such growth of the field oxide film 41, the field oxide film can be thickly grown even under low temperature and a flat degree of the wafer is also prominent, thus a manufacture process is easy.

Figure 4C:
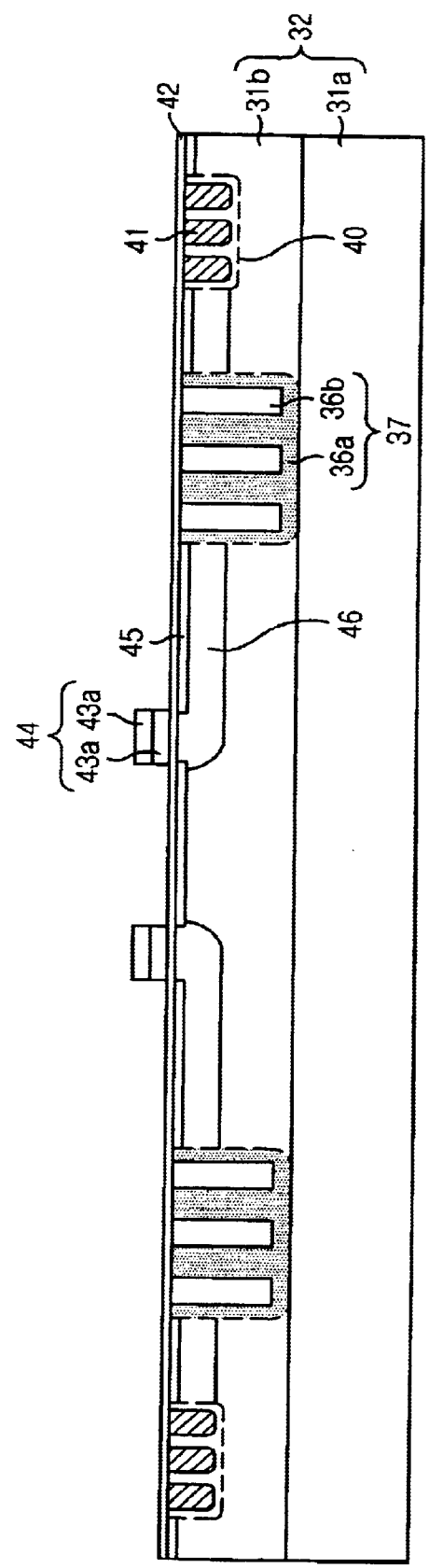

As shown in FIG. 4c, the field oxide film 41 buried into one or numerous trenches of FIG. 4b will be commonly explained as the field oxide film 41 buried into one trench in the following description.

Next, the second silicon nitride film 39 and the second silicon oxide film 38 are removed, and then a gate oxide film 42 is formed by a thickness of 10 nm~80 nm on an overall face containing the P⁻ epitaxy layer 31b which has the formation of the field oxide film. Then, the gate electrode 44 formed as an accumulation structure of polysilicon 43a and tungsten silicide 43b is formed on the gate oxide film 42.

Subsequently, N⁻ impurity is ion-injected by using the gate electrode 44 as the mask, to form an LDD (Lightly Doped Drain) area 45 for drifting electron injected into the channel layer to a drain area on the P⁻ epitaxy layer 31b except the P⁺ sinker 37. At this time, the LDD area 45 is not formed on a sinker area where the P⁺ polysilicon column 36b is formed.

A graded channel ion injection is performed on a structural overall face having the formation of the LDD area 45 to form an N-type channel layer 46 within the P⁻ epitaxy layer 31b except a portion where a succeeding drain will be formed. At this time, the channel layer 46 is formed more deeply than the depth of the ion injection of the LDD area 45, and is formed by a lateral diffusion, spreading over one side of the gate electrode 44, in detail, over an overall area of the source area, towards the drain side.

Like this, breakdown voltage between source and drain of the HF power device is increased by forming the LDD area 45 and the channel layer 46.

Figure 4D:
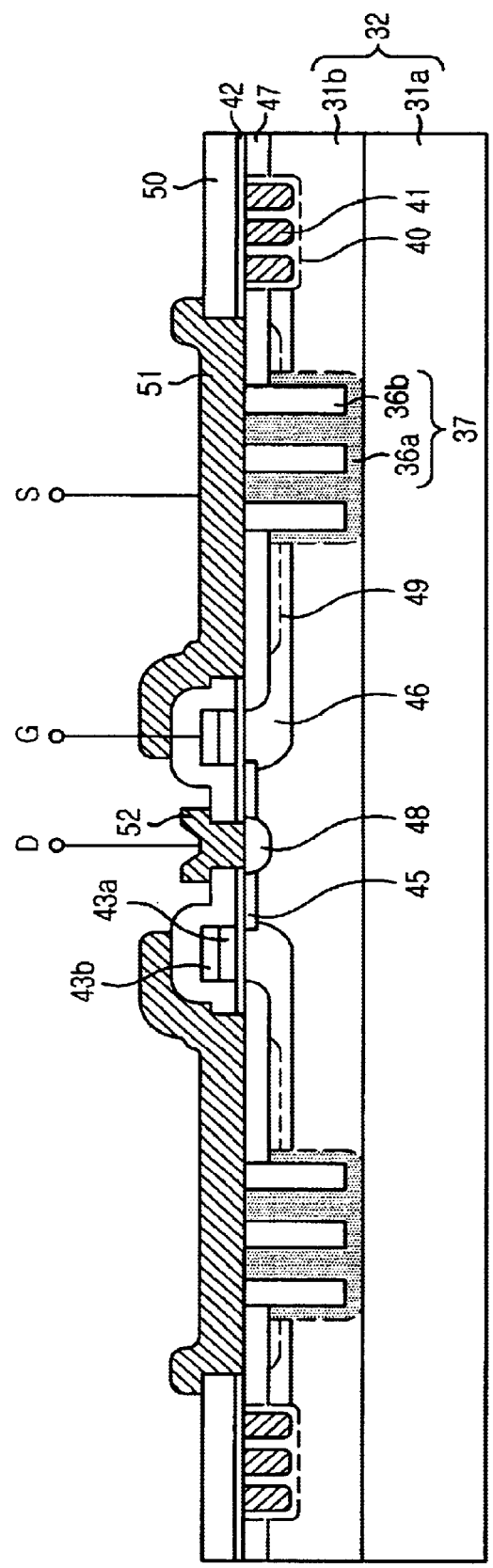

As shown in FIG. 4d, the photosensing film (not shown) is deposited on an overall structural face having the formation of the channel layer 46, and the mask for forming the N⁺ source and drain through the exposure and developing is formed. At this time, the mask for forming the N⁺ source and drain exposes overall the source area in order to perform the ion injection of the source area and only a given area on the drain area is exposed so that a following LDD area 45 is remained.

Secondly, the N⁺ source area 47 and the N⁺ drain area 48 are formed within the channel layer 46 by the N⁺ type impurity ion injection through a use of the mask. Herewith, the N⁺ source area 47 is formed within the channel layer 46 except the P⁺ sinker 37, and the N⁺ drain area 48 is contacted with the LDD area 45 and is formed only within the P⁻ epitaxy layer 31b. Like the above, when the N⁺ source area 47 is formed, the P⁺ sinker 37 composed of the P⁺ doping layer 36a and the P⁺ polysilicon column 36b is formed as a column shape piercing through the inside of the N⁺ source area 47, to thus perform a division into two source areas, namely, into respective source areas of adjacent devices.

Then, a P⁺ enhancement ion injection is executed only to the N⁺ source area 47 side in order to reduce the resistance of the P⁺ sinker 37, to formed the P⁺ enhancement layer 49 which is spread over the N⁺ source area 47, the channel layer 46 and the P⁺ sinker 37. At this time, in forming the P⁺ enhancement layer 49, it is formed more deeply than the depth of the N⁺ source area 47 and more shallowly than the channel layer 46.

Next, a first inter-layer insulation film 50 is formed on an overall face of the structure, after that, the first inter-layer insulation film 40 is selectively patterned, to expose the P⁺ sinker 37, the N⁺ source area 47 and the N⁺ drain area 48. On this exposed portion, a metal film is formed, then this metal film is selectively to form source electrode 51 and drain electrode 52. Herewith, the source electrode 51 is coupled with the N⁺ source area 47 divided into two source areas and the P⁺ sinker 37, and is overlapped on the total area of the gate electrode 44.

Figure 5:
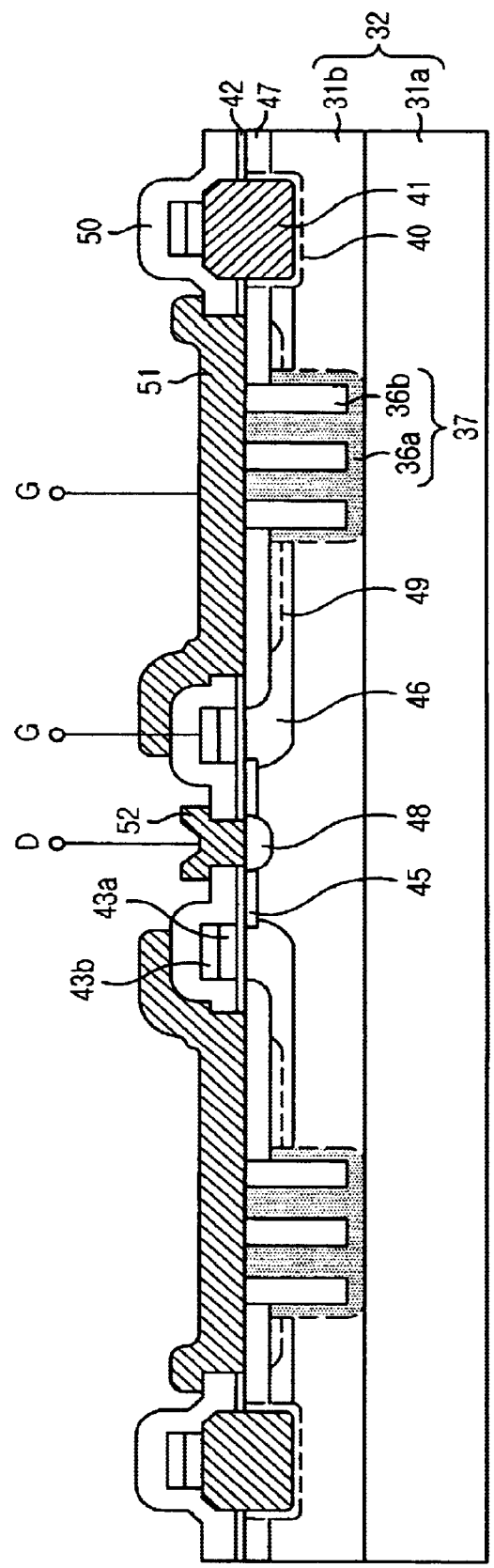
FIG. 5 is a structural sectional view of an HF LDMOS in a second embodiment of the present invention.

FIG. 5 is a structural sectional view of the HF power device in a second embodiment of the present invention, and is same as the first embodiment in all processes, excepting of the process for forming the field oxide film.

First, one or a plural number of trenches are formed, impurity is doped and diffused on the trench to form the P⁺ doping layer 36a on the neighborhood of the trench, and then the P+ polysilicon column 36b is buried into the trench to form the P+ sinker 37 based on a column shape.

Next, one side of the P− epitaxy layer 31b is etched by a given depth to form the trench where the field oxide film will be formed, and the field ion is injected into the trench to form the channel stop layer 40. Herewith, differently from the first embodiment, only one trench is formed in forming the trench.

Subsequently, the silicon oxide film is covered on an overall face containing the trench having the formation of the channel stop layer 40, and after that, the chemical mechanical polishing (CMP) process is executed and the field oxide film 41 flatly buried into the trench is then formed.

Figure 6:
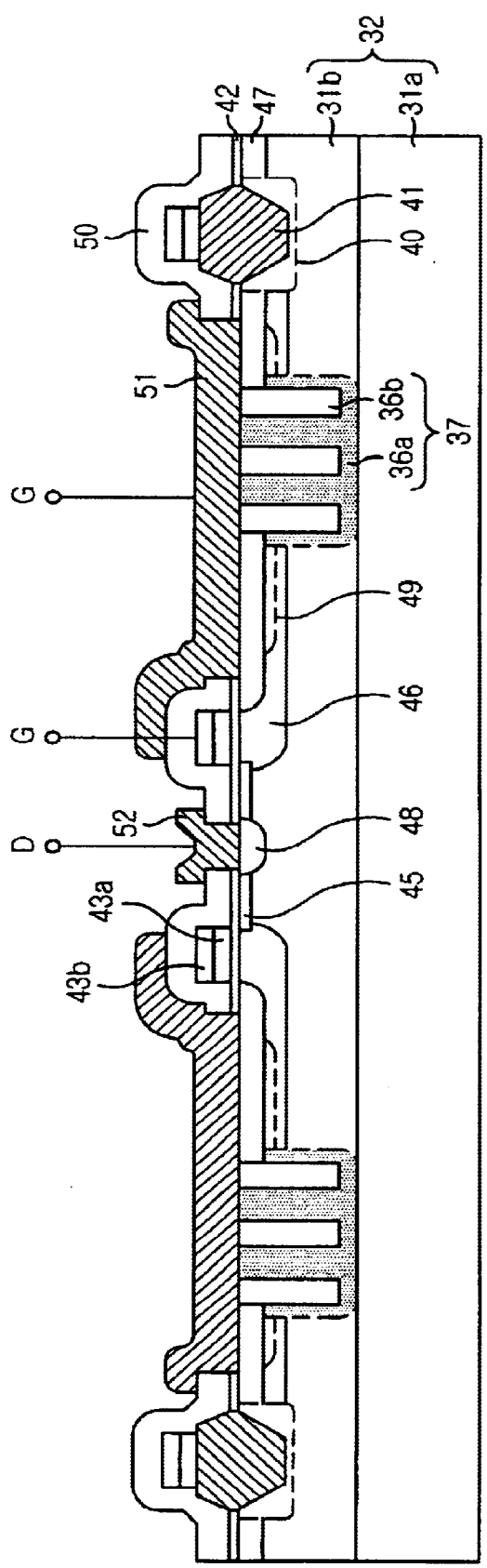
FIG. 6 indicates a structural sectional view of an HF LDMOS in a third embodiment of the present invention.

FIG. 6 is a structural sectional view of the HF power device in a third embodiment of the present invention, and is same as the first and second embodiments in all processes, excepting of the process for forming the field oxide film.

First, one or a plural number of trenches are formed, the impurity is doped and diffused on the trench to form the P+ doping layer 36a on the neighborhood of the trench, and then the P+ polysilicon column 36b is buried into the trench to form the P+ sinker 37 based on the column shape.

Next, one side of the P− epitaxy layer 31b is etched by a given depth to form the trench where the field oxide film will be formed, and the field ion is injected into the trench to form the channel stop layer 40. At this time, differently from the first embodiment, only one trench is formed in forming the trench.

Subsequently, a thermal oxidation process is executed in the trench having the formation of the channel stop layer 40, to form the field oxide film 41 buried into the trench.

As afore-mentioned, in accordance with the present invention, a process in an HF power device and its manufacturing method can be simplified since procedures for an ion injection of high energy and a high-temperature diffusion are no need by doping impurity in a trench formed in a source area and burying polysilicon to form a sinker. In addition, a sinker based on a low resistance can be easily formed by a low thermal anneal procedure under 1000° C., thus a parasitic resistance and a parasitic capacitance are reduced so as to be applicable not only to a band of 1~3 GHz but also to a high-speed power device of a frequency band higher than that.

Further, a high-temperature thermal anneal procedure is not required by forming a trench in forming a field oxide film and by performing an oxidation of a trench inside or covering with an oxide film to form a buried field oxide film, and a flat degree of a wafer can be also improved with a reduction of a device area.

It will be apparent to those skilled in the art that various modifications and variations can be made in the present invention without deviating from the spirit or scope of the invention. Thus, it is intended that the present invention cover the modifications and variations of this invention provided they come within the scope of the appended claims and their equivalents.

What is claimed is:

1. A method of manufacturing an HF power device comprising the steps of:

forming a semiconductor layer as a first conductive type on a semiconductor substrate as the first conductive type;

etching the semiconductor layer by a given depth and forming a first trench;

doping impurity of the first conductive type on the neighborhood of the first trench and forming a first impurity layer as the first conductive type connected to the semiconductor substrate;

burying a conduction film as the first conductive type into the first trench;

etching the semiconductor layer by a given depth and forming a second trench with a constant interval from the first trench;

forming a field oxide film buried into the second trench;

forming gate electrode on a given surface of the semiconductor layer;

forming a source area of a second conductive type on the surface of the semiconductor layer so as to be structurally self-aligned on one side of the gate electrode and be structurally pierced by the conduction film;

forming a drain area as the second conductive type on the surface of the semiconductor layer with a given interval from another side of the gate electrode;

forming an LDD area of the second conductive type on the surface of the semiconductor layer between the drain area and the gate electrode;

forming first metal electrode having a width which reaches the source area and the gate electrode; and forming second metal electrode electrically connected to the LDD area.

2. The method of claim 1, wherein in the first trench forming step, said semiconductor layer is etched by a depth reaching the semiconductor substrate.

3. The method of claim 1, wherein in the first trench forming step, one or a plural number of trenches are formed by etching the semiconductor layer.

4. The method of claim 3, wherein said first impurity layer is formed on the plural number of trenches with the conductive type same as the substrate of the first conductive type, and neighboring first impurity layers are coupled with each other to form a column shape.

5. The method of claim 1, wherein the second trench forming step is performed by etching the semiconductor layer and forming one or the plural number of trenches.

6. The method of claim 1, wherein the field oxide film is performed by growing the thermal oxide film in the inside of said second trench.

7. The method of claim 1, wherein the field oxide film forming the step comprises the steps of:

covering the semiconductor layer of the first conductive type containing the second trench with an oxide film; and forming the field oxide film buried into the second trench by executing a chemical mechanical polishing for the covering film.

* * * * *